(12) United States Patent
Okandan et al.

(10) Patent No.: US 6,348,806 B1
(45) Date of Patent: Feb. 19, 2002

(54) METHOD AND APPARATUS FOR MEASURING GATE LEAKAGE CURRENT IN AN INTEGRATED CIRCUIT

(75) Inventors: Murat Okandan, State College, PA (US); Jules D. Campbell, Jr., Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/271,892

(22) Filed: Mar. 18, 1999

(51) Int. Cl.[7] .............................................. G01R 31/28
(52) U.S. Cl. ...................................................... 324/763
(58) Field of Search ................................. 324/765, 763, 324/719, 613, 520, 158.1, 73.1; 438/14, 18, 17; 257/40, 48; 714/733, 734

(56) References Cited

U.S. PATENT DOCUMENTS

| 4,542,340 A | 9/1985 | Chakravarti et al. ........ 324/158 |
| 5,656,511 A | 8/1997 | Huang ......................... 365/201 |
| 5,804,975 A * | 9/1998 | Alers et al. ................. 324/613 |

OTHER PUBLICATIONS

Depas, et al., "Soft Breakdown of Ultra–Thin Gate Oxide Layers", IEEE Transactions on Electron Devices, vol. 43, No. 9, pp. 1499–1507, Sep. (1996).

Lee, et al., "Quasi–Breakdown of Ultrathin Gate Oxide Under High Field Stress", IEEE, International Electron Devices Meeting, pp. 605–608 (1994) (Month unavailable).

* cited by examiner

Primary Examiner—Vinh P. Nguyen
(74) Attorney, Agent, or Firm—James L. Clingan, Jr.

(57) ABSTRACT

An integrated circuit (10) includes a measurement circuit (20) for determining if a transistor (26) has normal gate leakage current or has a gate leakage current which is greater than normal. A transistor such as transistor (26) may be in a condition known as quasi-breakdown which typically occurs in response to some electrical stress. The characteristic of quasi-breakdown is that there is a very significant increase in gate leakage current, the transistor continues to function as a transistor but perhaps with degraded performance, and the transistor will fail if it continues to receive the stresses that caused it to go into quasi-breakdown. Thus, the measurement circuit (20), which is included on the integrated circuit (10), provides an early warning that a transistor, a device under test (26), is going to fail if the operating conditions remain the same.

4 Claims, 3 Drawing Sheets

METHOD AND APPARATUS FOR MEASURING GATE LEAKAGE CURRENT IN AN INTEGRATED CIRCUIT

FIELD OF THE INVENTION

Integrated circuits having devices which are susceptible to having quasi-breakdown of a gate dielectric.

BACKGROUND OF THE INVENTION

One of the things that happens when integrated circuits are put into a system is that the system fails if one of the integrated circuits fail. It is desirable that the system failures be avoided and if not completely avoided, predicted, so that anticipatory repairs can be done to avoid a failure at a critical moment. Generally, integrated circuits are highly reliable and systems are reliable, but not completely so. Integrated circuits do fail, and when that happens, the system will likely fail also. Sometimes these system failures can lead to major consequential issues. Simple examples would be automobile failure. Perhaps a more critical failure would be in medical equipment or military hardware. These are examples where equipment may be a critical link in a function where lives may be at stake. If there is a warning that it may fail, then a repair can be performed prior to the critical usage. Another potential value in being able to predict a failure would be to be readying a redundant system where one may not have been automatically available or ensuring the availability of a spare to quickly replace the system immediately upon its failure. Another potential use would be being able to make design corrections before very many system failures occur because information that system failures were imminent would be available Design fixes could be made so that newly designed replacements could be made ready before system failures actually began occurring. Accordingly, there is a need for the ability to anticipate when an IC will fail and particularly beneficial when it can be specifically predicted with respect to a specific device when the device is already in a system.

DETAILED DESCRIPTION OF THE PREFERRED EMBODIMENT

Figure 1:
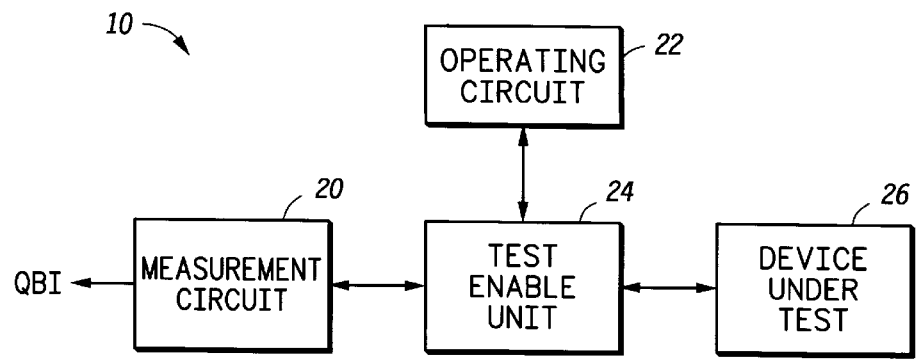
FIG. 1 is a block diagram of an integrated circuit according to one embodiment of the invention.

Semiconductor devices made with quite small gate oxide (or perhaps a different dielectric) dimensions, such as 40 angstroms or less, have a phenomenon known as quasi-breakdown. Quasi-breakdown is a major increase, two to three orders of magnitude, in gate leakage current which, although large, does not cause a catastrophic failure of the transistor. The transistor continues to operate as a transistor. Its performance may be degraded, but it is still functional. Quasi-breakdown is generally caused by electrical stresses. One of the characteristics of this is that if these electrical stresses which caused it to go into the quasi-breakdown condition continue, the device will experience catastrophic failure. For such a catastrophic failure of a transistor, it is likely that the entire integrated circuit will fail and thus cause the failure of the system in which the integrated system is located. Another characteristic of quasi-breakdown is that the current density of the leakage is very predictable from a magnitude standpoint. That is, for a given process, gate oxide/dielectric thickness, and gate dimension, there can be determined a specific gate current leakage threshold or level which, if exceeded, means that the device is certain to be in quasi-breakdown. Although gate characteristics will not be identically the same from one integrated circuit to another due to process variations and will cause a change in the normal gate leakage and also the quasi-breakdown leakage, those variations are very small compared to the variation between a normal leakage current and a leakage current due to quasi-breakdown. Another aspect of a device that is in quasi-breakdown is that a stress on such a device may cause a catastrophic failure which would not cause a catastrophic failure in a normal device. For example, if the power supply were to go to a significantly higher voltage than is considered safe, a device in quasi-breakdown may fail catastrophically whereas a normal device with normal gate leakage might not fail in that same condition. The device which is in quasi-breakdown is weakened and the continuing stresses being received under these conditions will ultimately cause a failure. Another adverse possibility for the case where quasi-breakdown has already been reached and the device thus weakened is that an unusually high stress may be applied which can cause such a weakened device to fail whereas it may not have failed even under this relatively high stress if it were normal and had not reached the quasi-breakdown condition.

Described here are circuits which will measure gate leakage current of devices which are capable of having quasi-breakdown and from that a determination can be made if the device is in quasi-breakdown. Because the quasi-breakdown current is predictable and because of the large difference between quasi-breakdown leakage current and normal leakage current, the circuits do not have to be extremely precise in measuring the current. Even with these inaccuracies or lack of precision, there is certainty of the proper determination if the circuit is in quasi-breakdown or if it is in normal condition.

Shown in FIG. 1, is an integrated circuit 10 comprising a measuring circuit 20, an operating circuit 22, a test enable unit 24, and a device under test 26. In normal operation, test enable unit 24 couples operating circuit 22 to device under test 26. Device under test 26 is at least one transistor which is used in normal operation of integrated circuit 10 when the test feature is not being utilized. Operating circuit 22 and device under test 26 are formed by a plurality of transistors which collectively form circuitry which performs some predetermined function. The test enable unit 24 couples measurement circuit 20 to the device under test 26 and decouples operating circuit 22 from device under test 26. Thus, test enable unit 24 operates as selection circuit which selects device under test 26 for testing. Measurement unit 20 then measures the gate leakage current of device under test 26. If the leakage current is sufficiently high, then it is considered to be in quasi-breakdown. A threshold for gate leakage current being sufficient to indicate that quasi-breakdown has occurred is relatively easy to set because of the large difference between normal gate leakage and quasi-breakdown gate current leakage. As such, measurement circuit 20 sends out a quasi-breakdown indicator signal QBI. The quasi-breakdown indicator signal QBI indicates that the integrated circuit 10 has at least one device, device under test 26, which will, if continued in the type of operation as experienced so far, is going to fail. Thus, the circuit is still operational so that integrated circuit 10 is functional, but there has thus been detected the certainty that it is going to fail if integrated circuit continues in the same type of operation. There is then the advantage of having an operational circuit but also a warning so that something can be done to either prevent an operational failure at a critical time or to ready a replacement so that down time of a system that contains integrated circuit 10 is minimized.

Figure 2:
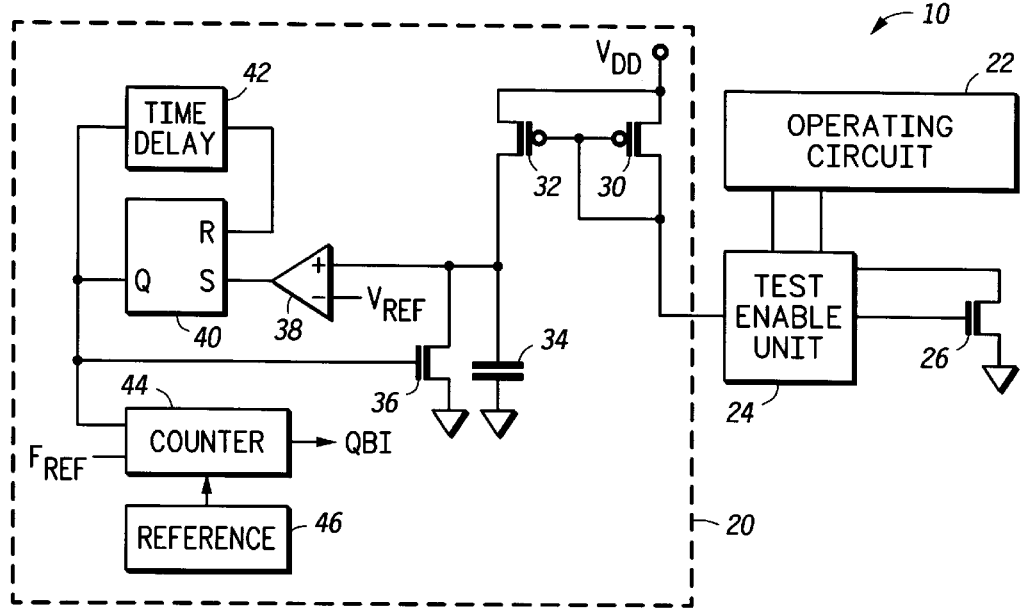
FIG. 2 is a combination block diagram and circuit diagram of the integrated circuit of FIG. 1.

Shown in FIG. 2, is a more detailed version of integrated circuit 10 of FIG. 1. Shown in FIG. 2 is device under test 26 shown as an N channel transistor having a gate, drain, and source. The drain and gate of transistor 26 are coupled to test enable unit 24. Measurement circuit 20 comprises a P channel transistor 30, a P channel transistor 32, a capacitor 34, and an N channel transistor 36, a comparator 38, an RS flip-flop 40, a time delay 42, a counter 44, and a reference 46. Transistor 30 has a source connected to a positive power supply terminal VDD, and a gate and a drain coupled to test enable unit 24. Transistor 32 has a source connected to VDD, a gate connected to the gate of transistor 30, and a drain. Capacitor 34 has a first electrode coupled to the drain of transistor 32, and a second electrode coupled to a negative power supply terminal shown in FIG. 2 as ground. Transistor 36 has a drain connected to the first electrode of capacitor 34, a source connected to ground, and a gate. Comparator 38 has its positive input coupled to the first electrode of capacitor 34 and its negative input coupled to Vref., and it has an output. RS flip-flop 40 has its set input S coupled to the output of comparator 38, an R input, and a Q output. Time delay 42 has an input coupled to the Q output of RS flip-flop 40, and an output coupled to the R input of RS flip-flop 40. Counter 44 has an input coupled to the Q output of RS flip-flop 40, a second input for receiving a reference clock signal Fref, and an output for providing the quasi-breakdown indicator signal QBI. RS flip-flop 40 can be considered a type of latch. Ref. 46 has an output coupled to counter 44. The Q output of flip-flop 40 is coupled to the gate of transistor 36. In normal operation of integrated circuit 10, operating circuit 22 is coupled to device under test 26 by way of test enable unit 24.

When device under test 26 is to be measured for its leakage current at its gate, its drain is coupled to ground, and its gate is coupled to the drain of transistor 30. With device under test 26 having some leakage, transistor 30 will become conductive so that some current will flow through transistor 30. Transistors 30 and 32 act as a current mirror. The current that flows through transistor 30 is mirrored to transistor 32 so that the current through 32 is an accurate measure of the leakage current which passes through transistor 26. The current through transistor 32 charges capacitor 34 and can be considered a type of integrator. In this the integrator is a current charging a capacitive device. When the charge on capacitor 34 exceeds the voltage of reference voltage VRef, comparator 38 provides a logic high output which sets RS flip-flop 40 so that the Q output is a logic high. The Q output being a logic high causes transistor 36 to be conductive which completely discharges capacitor 34.

There is a short delay in time provided by delay 42 so that the logic high on output Q appears as a logic high on input R a short time after the output of Q switches from a logic low to a logic high. When the input to input R switches to a logic high, the Q output becomes a logic low. With the output Q being a logic low, transistor 36 becomes nonconductive so that capacitor 34 can become charged again from the current passing through transistor 32. The rate at which capacitor 34 charges to the voltage Vref is a function of the capacitance of capacitor 34 and the current passing through transistor 32. The more current that passes through transistor 32, the faster capacitor 34 will charge. The faster capacitor 34 charges, the faster the plus input of comparator 38 will exceed Vref. The faster that happens, the faster the output of comparator 38 will switch to a logic high, which in turn will cause the output Q to switch to a logic high.

Counter 44 counts according to the frequency of its two inputs, Fref and the Q output of RS flip-flop 40. Thus, for every cycle that counter 44 counts, it will have a count based upon the current through transistor 32. The current through transistor 32 is an accurate measure of the gate leakage current through transistor 26. If transistor 26 is in its normal condition and not in its quasi-breakdown condition, there will be a frequency of the output of RS flip-flop 40 which is relatively low. This frequency is quite predictable because the normal leakage is quite predictable. Thus, the reference 46 can be set to a value which reflects what is the normal count that would be expected if device under test 26 has normal leakage. This value of reference 46 can be set with substantial margin because there is about two orders of magnitude difference between normal leakage and leakage of quasi-breakdown. In the case where there is quasi-breakdown, the frequency of the output RS flip-flop 40 will be about 100 times faster than the frequency when device under test 26 has normal leakage, thus reference 46 can be set to be three, four, five, even 10 times higher than normal. Thus when quasi-breakdown is reached, if it is reached, counter 44 will attain a count value which far exceeds the predetermined count value of the reference which is then the threshold for easy detection of quasi-breakdown. Counter 44 is incremented by the output of flip-flop 40 for the duration of the period of Fref. Thus counter 44 performs a count for each period of Fref. When the count exceeds reference 46, counter 44 provides a quasi-breakdown indication by generating output signal QBI. Signal QBI indicates that quasi-breakdown has occurred. If signal QBI is active, then a user of integrated circuit 10 can be alerted that this integrated circuit is going to fail if conditions continue as they have in the past. Capacitor 34, comparator 38, flip-flop 40, and transistor 36, and time delay 42 can be considered a relaxation oscillator which is a current controlled oscillator. The effect is, with the additional use of a current mirror comprised of transistors 30 and 32, that leakage current is converted to a frequency.

Figure 3:
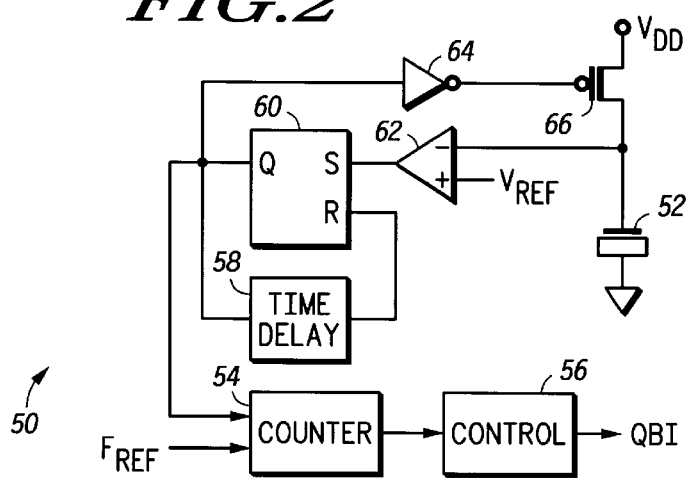
FIG. 3 is a combination block diagram and circuit diagram of a circuit of an integrated circuit according to an alternate embodiment of the invention.

Shown in FIG. 3 is a circuit 50 as an alternative embodiment to that shown in FIG. 2 for generating quasi-breakdown indicator signal QBI. Circuit 50 includes a device under test as an integral part of a circuit for determining if the device under test has normal leakage or that associated with quasi-breakdown. The principle of operation is very similar to that shown in FIG. 2. Integrated circuit 50 comprises a device under test 52, a counter 54, a control 56, a delay 58, a RS flip-flop 60, a comparator 62, an inverter 64, and a P channel transistor 66. Device under test 52 is shown as an N channel transistor with its source and drain connected together and connected to ground, and having a gate. This type of connection is sometimes used to provide a capacitor for a circuit. Transistor 66 is a P channel transistor having a source connected to VDD, a drain connected to the gate of device under test 52, and a gate. Comparator 62 has a negative input connected to the gate of device under test 52, a plus input connected to a voltage reference, Vref, and an output. RS flip-flop 60 has an R input, and an S input coupled to the output of comparator 62, and an output Q. Delay 58 has an input coupled to the Q output of RS flip-flop 60 and an output connected to the R input of RS flip-flop 60. Inverter 64 has an input connected to the Q output of RS flip-flop 60 and an output coupled to the gate of transistor 66. Counter 54 has a first input coupled to the Q output of RS flip-flop 60 and a second input for receiving a reference clock signal Fref and an output. Control 56 has an input for receiving the output of counter 54 and an output for providing quasi-breakdown indicator signal QBI.

Figure 4:
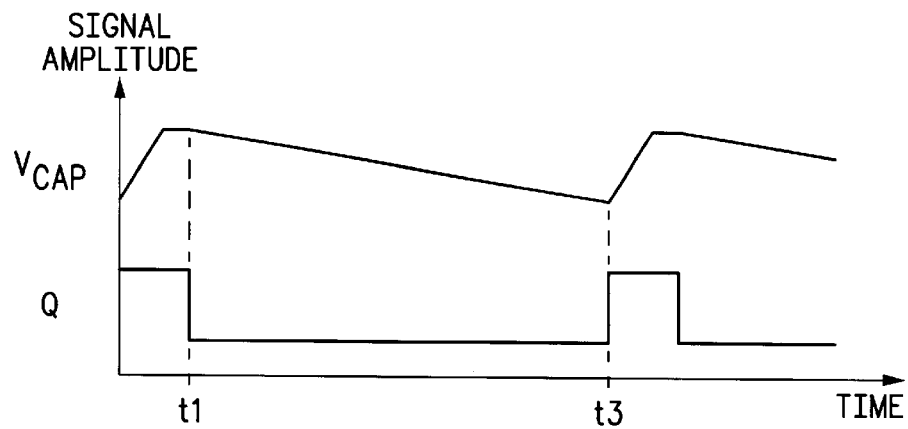
FIG. 4 is a timing diagram for the circuit of FIG. 3.

Shown in FIG. 4 is a timing diagram of a signal V cap which is on the gate of transistor 52, the device under test. Device under test 52 has capacitance and it has leakage which is greater when it is in quasi-breakdown. When it is not in quasi-breakdown, it still has leakage, but about a two orders of magnitude less leakage. The principle of operation is very similar to that described for measurement circuit 20 shown in FIG. 1. In the case of FIG. 3, however, device under test 52 is precharged to VDD by transistor 66 and then discharged by its own leakage. When device under test 52 is in quasi-breakdown, the capacitance will be discharged at a much faster rate than when it is in normal condition, about a factor of 100 difference. The output of RS flip-flop 60 will have a frequency which is directly dependent upon the rate of discharge of the capacitance of device under test 52. This is shown by reference to FIG. 4 and to FIG. 5. FIG. 4 shows the condition by which the device under test 52 is in its normal condition.

The capacitance device under test 52 is initially precharged to VDD by transistor 66 and is discharged to Vref by its own leakage. The time at which this discharge begins is shown in FIG. 4 as time T1. When the voltage on the gate of device under test 52 lowers to Vref, comparator 62 sets the output of RS flip-flop 60 to a logic high which causes inverter 64 to provide a logic low output which causes transistor 66 to become conductive. The time at which inverter 64 switches to the logic low condition and transistor 66 becomes conductive is shown as time T3 in FIG. 4. Thus the time to discharge device under test when it is normal is the time from T1 to T3. After transistor 66 becomes conductive, device under test 52 begins charging toward VDD. The output of RS flip-flop 60 will remain a logic high until time delay 58 times out at which time the Q output of RS flip-flop so will switch to a logic low which causes transistor 66 to become nonconductive. Time delay 58 is designed to be sufficiently long to ensure that device under test 52 is precharged to VDD.

Figure 5:
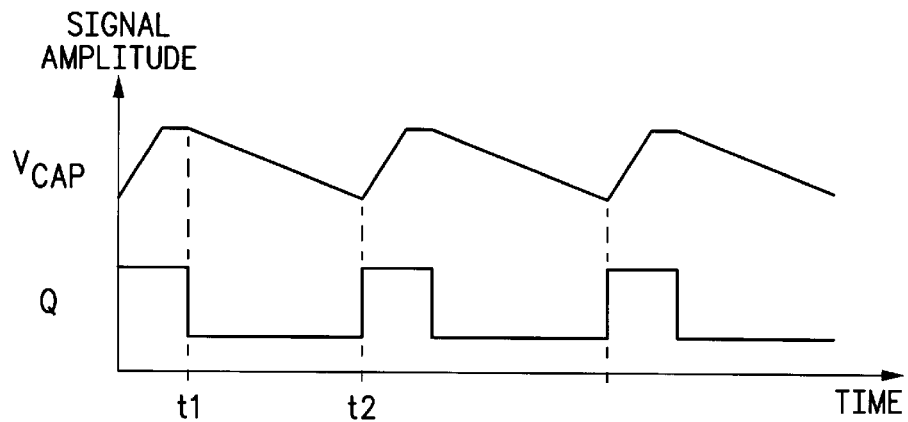
FIG. 5 is an alternative timing diagram for the circuit of FIG. 3.

FIG. 5 shows the discharge rate or the condition when device under test 52 is in its quasi-breakdown condition. In that condition, the leakage current that discharges the capacitance of device under test 52 is much greater so the rate at which the voltage drops on the minus input of comparator 62 is much greater than it is for the condition when device under test 52 has normal leakage. The point at which device under test 52, when it is in quasi-breakdown, is discharged to Vref is time T2 as shown in FIG. 5. For this case, the time to discharge to Vref is from time T1 to time T2 which is much less than that for a normal device as shown in FIG. 4. This lower time to discharge results in a signal with a higher frequency. Note, however, that the relative frequencies as shown in FIGS. 4 and 5 are not to scale. With the frequency on the output of RS flip-flop 60 being much greater for the quasi-breakdown condition than it is for the normal condition, the output of RS flip-flop 60 is measured by counter 54 in relation to signal Fref. This gives a clear indication of whether the device under test 52 is in its quasi-breakdown or in its normal condition.

Control 56 is provided to provide quasi-breakdown indicator signal QBI according to the output of counter 54. Control 56 could be used to provide the actual counter output or simply a signal indicating that the quasi-breakdown condition has been reached such as signal QBI. Device under test 52 could be either a normal device that in which its source and drain are switched to ground and its gate is switched to a current measuring circuit, or it can be directly connected to a current measuring circuit and hard-wired in its present condition. This would be particularly useful in a case where it is desired to determine at the time of manufacture if a device is already in its quasi-breakdown condition. Other variations to FIG. 3 would be available. Device under test 52 could also be subjected to predetermined conditions or conditions that are analogous to the environment that the integrated circuit as a whole would experience.

Figure 6:
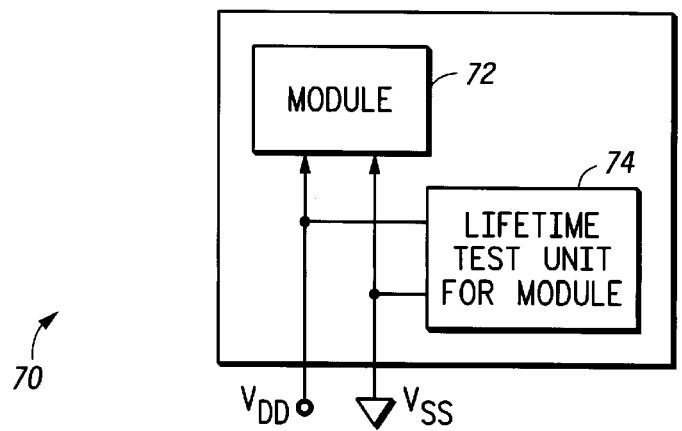
FIG. 6 is a block diagram of an integrated circuit according to another alternate embodiment of the invention.

Shown in FIG. 6, is an integrated circuit 70 comprising a functional module 72 and a lifetime test unit 74. Module 72 is a functional unit of integrated circuit 70 which can be any such functional unit, for example an arithmetic logic unit, a shift register, a barrel shifter, an A/D converter, or phase lock loop. Lifetime test unit 74 includes inputs which receive power supply signals VDD and VSS which are also received by module 72. Such power supplies can vary in magnitude and can have spikes or other variations or can have sustained periods of high voltage or negative voltage even in the case of VSS. Lifetime test unit 74 would experience those same anomalies as module 72. And if they weren't anomalies, but just steady state conditions, lifetime test unit 74 would experience those as well. Thus, lifetime test unit 74 would include a device under test such as that shown in FIG. 3 as device under test 52 which would be subjected to experiences analogous to those experienced by module 72. Thus, the lifetime test unit 74 would have a device which does not actually have a circuit function for the normal operation of integrated circuit 70 but would have a gate leakage current expected to have the same characteristics as those transistors in module 72. Thus, lifetime test unit 74 can be a very small portion of integrated circuit 70, but can provide information which would be representative of that in module 72. In such a test, lifetime test unit 74 would provide a signal QBI when its device under test included therein indicated that it was in the quasi-breakdown condition. Thus, a user of integrated circuit 70 would have an indication that module 72 is likely to fail if the conditions it has experienced previously are going to continue. Or further, that module 72 might fail under a stress condition that it would not fail if it did not have devices that were in quasi-breakdown.

Figure 7:
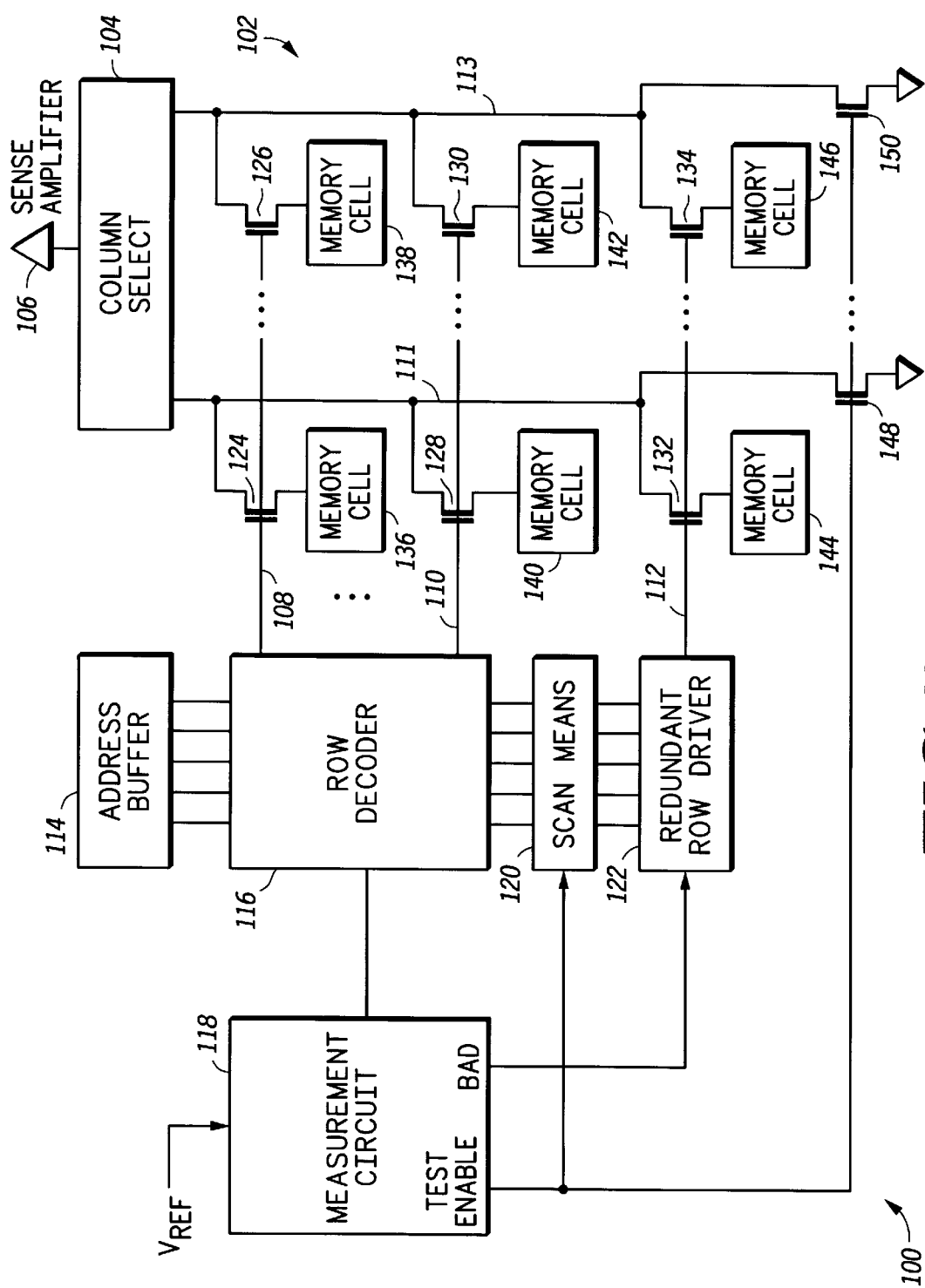
FIG. 7 is a combination block diagram and circuit diagram of an integrated circuit memory according to yet another alternate embodiment of the invention.

Shown in FIG. 7 is an integrated circuit 100 comprising a memory array 102, a column select circuit 104, an amplifier 106, a word line 110, and a redundant word line 112, an address buffer circuit 114, row decoder 116, a measurement circuit 118, a scan means 120, and a redundant row driver 122. Array 102 comprises select transistors 124, 126, 128, 130, 132, 134; memory cell portions 136, 138, 140, 142, 144, and 146; bit lines 111 and 113; and word lines 108, 110, and 112. In actual operation of course, memory array 102 would have many, many more memory cell portions, select transistors, word lines, and bit lines than are shown in this FIG. 7. A memory cell portion in a DRAM would be a capacitor and in a SRAM would be a cross coupled latch. In normal operation, row decoder 116 would select normal word line 108, 110, or another one not shown based upon addresses provided by address buffer 114. Redundant row driver is available to enable word line 112, but that would not occur under normal conditions. Although memories typically are designed to include row redundancy which is implemented if a defective row is detected during testing before the memory is shipped to a customer, redundant word line 112 is not for replacing defective word lines that are detected as being defective prior to shipment. Memory 100 may include that type of redundancy in addition to redundant word line 112.

Under conditions of testing for gate leakage of transistors 124, 126, 128, and 130 or other transistors coupled to word lines, row decoder 116 will couple a selected word line to measurement circuit 118. Measurement circuit 118 also enables transistors 148 and 150 to place bit lines 111 and 113 to a known state, ground in this case, to facilitate the gate leakage current measurements. Circuit 118 would be analogous to measurement circuit 20 in FIG. 1 and FIG. 2 or the circuit shown in FIG. 3. If measurement circuit 118 determined that one of the word lines had a gate leakage problem, such as having a transistor coupled thereto being in quasi-breakdown, then measurement circuit 118 would enable redundant row driver 122 and disable the particular portion of row decoder 116 which selected the word line which had the transistor or transistors which had the gate leakage problem. This is effectively a repair of memory array 102. The testing of memory array 102 would be further enabled by the inclusion of transistors 148 and 150 which would couple bit lines 152 and 154 to ground during the time that memory array 102 is being tested for having transistors which are in the quasi-breakdown condition.

A memory such as integrated circuit 100 is particularly conducive to being tested for quasi-breakdown. There is a long string of transistors with their gates coupled together for every word line. This is particularly efficient for testing for quasi-breakdown. Many transistors can be tested at the same time. It also may not be necessary to identify which particular transistor has the quasi-breakdown, but simply which word line has a transistor which in the quasi-breakdown condition.

As has been described, the implementation of testing for quasi-breakdown can be achieved in several ways with differing advantages. Further, there may be other alternatives which are properly intended to be covered by the scope of the claims.

What is claimed is:

1. An integrated circuit, comprising:
    a first circuit; and
    a measurement circuit coupled to the first circuit, the measurement circuit adapted to measure gate leakage current of the first circuit, the measurement circuit comprising a quasi-breakdown indication means, the quasi-breakdown indication means adapted to provide a quasi-breakdown indication when the gate leakage current exceeds a predetermined threshold;
    wherein the measurement circuit comprises a current-to-frequency converter; and
    wherein the current-to-frequency converter comprises:
        a current controlled oscillator, comprising:
            a first current integrator adapted to integrate the gate leakage current into an input voltage;
            a first comparator adapted to compare the input voltage to a reference voltage;
            a latch coupled to an output of the first comparator and having an output; and
            a first charging circuit coupled to the first current integrator, the first comparator, and the output of the latch.

2. The integrated circuit of claim 1, wherein the first current integrator is a capacitive device.

3. The integrated circuit of claim 1, wherein the current controlled oscillator further comprises:
    a current mirror which is coupled to the first circuit.

4. An integrated circuit, comprising:
    a first circuit; and
    a measurement circuit coupled to the first circuit, the measurement circuit adapted to measure gate leakage current of the first circuit, the measurement circuit comprising a quasi-breakdown indication means, the quasi-breakdown indication means adapted to provide a quasi-breakdown indication when the gate leakage current exceeds a predetermined threshold;
    wherein the measurement circuit comprises a current-to-frequency converter; and
    wherein the current-to-frequency converter comprises:
        a current controlled oscillator, comprising:
            current integrator means for integrating the gate leakage current into an input voltage;
            comparator means for comparing the input voltage to a reference voltage and providing an output;
            latch means, coupled to the comparator means, for latching the output of the comparator means; and
            charging means, coupled to the current integrator means, for discharging the current integrator means in response to the latch means.

* * * * *